(12) United States Patent
Ang et al.

(10) Patent No.: US 7,608,926 B2
(45) Date of Patent: Oct. 27, 2009

(54) NONVOLATILE SEMICONDUCTOR MEMORY DEVICE

(75) Inventors: Kern-Huat Ang, Johor (MY); Chai-Chen Liu, Hsinchu (TW); Chiang-Yung Ku, Hsinchu (TW); Jui-Feng Jao, Toufen Township, Miaoli County (TW); Sheng-Chen Wang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 493 days.

(21) Appl. No.: 11/326,904

(22) Filed: Jan. 6, 2006

(65) Prior Publication Data

US 2006/0186546 A1   Aug. 24, 2006

Related U.S. Application Data

(62) Division of application No. 10/767,276, filed on Jan. 29, 2004, now Pat. No. 7,012,021.

(51) Int. Cl.
*H01L 23/48* (2006.01)
*H01L 23/52* (2006.01)

(52) U.S. Cl. ............... 257/754; 257/209; 257/760; 257/E27.07

(58) Field of Classification Search ......... 257/754, 257/760, 776, E27.07, 530, 209, 296
See application file for complete search history.

(56) References Cited

U.S. PATENT DOCUMENTS 5,670,410 A   9/1997   Pan
5,686,356 A   11/1997  Jain et al.
6,008,104 A   12/1999  Schrems
6,261,851 B1  7/2001   Li et al.
6,294,457 B1  9/2001   Liu
6,391,768 B1  5/2002   Lee et al.
6,423,628 B1  7/2002   Li et al.
6,437,441 B1 *  8/2002  Yamamoto ............ 257/758
6,531,410 B2  3/2003   Bertin et al.
6,541,312 B2  4/2003   Cleeves et al.
6,566,757 B1 *  5/2003  Banerjee et al. ......... 257/758

(Continued)

FOREIGN PATENT DOCUMENTS

TW   317006   * 10/1997

(Continued)

*Primary Examiner*—Thanhha Pham
(74) *Attorney, Agent, or Firm*—Duane Morris LLP

(57) ABSTRACT

A new method to polish down conductive lines in the manufacture of an integrated circuit device is achieved. The method comprises providing a plurality of conductive lines overlying a substrate. A high density plasma (HDP) oxide layer is deposited overlying the substrate and the conductive lines. In the regions between the conductive lines, first planar surfaces of the HDP oxide layer are formed below the top of the conductive lines. The HDP oxide layer is sputtered down overlying the conductive lines such that second planar surfaces of the HDP oxide layer are formed above the conductive lines. A polish stopping layer is deposited overlying the HDP oxide layer. A film layer is deposited overlying the polish stopping layer. The film layer is polished down to the polish stopping layer overlying the second planar top surfaces. The film layer, the polish stopping layer, and the conductive lines are polished down to the polish stopping layer overlying the first planar top surfaces to complete the polishing down of the conductive lines.

9 Claims, 9 Drawing Sheets

U.S. PATENT DOCUMENTS

| | | | |
|---|---|---|---|
| 6,627,510 B1 * | 9/2003 | Evans et al. | 438/401 |
| 6,858,514 B2 | 2/2005 | Hsu et al. | |
| 2001/0019887 A1 * | 9/2001 | Jang et al. | 438/672 |
| 2004/0115914 A1 | 6/2004 | Manning | |

FOREIGN PATENT DOCUMENTS

| | | | |
|---|---|---|---|
| TW | 430592 | * | 4/1999 |
| TW | 410393 | * | 11/2000 |
| TW | 440938 | * | 6/2001 |

* cited by examiner

NONVOLATILE SEMICONDUCTOR MEMORY DEVICE

RELATED APPLICATION

This application is a divisional of application Ser. No. 10/767,276 filed Jan. 29, 2004 now U.S. Pat. No. 7,012,021, the contents of which are herein incorporated by reference as if set forth in their entirety.

BACKGROUND OF THE INVENTION

1. Field of the Invention

The invention relates to a method of manufacturing an integrated circuit device, and, more particularly, to a method of performing a chemical mechanical polish in the manufacture of an integrated circuit device.

2. Description of the Prior Art

Chemical mechanical polishing (CMP) is an important processing technology in modern integrated circuit manufacturing. CMP is used to planarize dielectric materials and to remove excess metal layers during the definition of damascene patterns. An additional use of CMP processing is the planarization and height adjustment of polysilicon lines during the formation of anti-fuse memory devices. This application of CMP is of particular importance to the present invention.

Referring now to FIG. 1, a small part of an anti-fuse memory array is shown in cross section. An anti-fuse memory is a non-volatile memory that can be programmed once but not erased. The memory comprises a first array of conductive lines 14 that are formed overlying a substrate 10. Typically, the first array of conductive lines 14 comprises polysilicon that has been doped to either p-type or n-type. In the example case, each line 14 comprises a first polysilicon layer 18, a metal silicide layer 22, and a second polysilicon layer 26 where the second polysilicon layer 26 is lightly doped n-type (N−). A first dielectric layer 30 surrounds the first array of conductive lines 14. A second array of conductive lines 38 and 42 is formed overlying the first array of lines 14. The second array of lines typically comprises a third polysilicon layer 38 that is doped to the opposite type of the second polysilicon layer 26. In this example, the third polysilicon layer 38 is heavily doped p-type (P+). A second metal silicide layer 42 overlies the third polysilicon layer 38.

In the typical arrangement, the first array of conductive lines 14 forms a plurality of bitlines of the memory array. In this case, BITLINE0 and BITLINE1 are shown. A single wordline may cross over several bitlines as is shown by the second conductive line 38 and 42 that is a wordline WORDLINE for the array. It is important to note that a thin layer of dielectric material 34 separates the wordline polysilicon 38 from the bitline polysilicon 26. If this thin dielectric layer 34 where not present, then the wordline polysilicon 38, which is P+, and the bitline polysilicon 26, which is N−, would form a PN junction or diode. The resulting diodes are shown as D0 and D1 in the illustration.

The anti-fuse memory operates as follows. If the thin dielectric layer 34 is intact, then current will not flow from the WORDLINE 38 to BITLINE0 14 or to BITLINE1 14 due to the insulator 34. If, for example, the WORDLINE 38 is biased to a positive voltage, BITLINE0 is grounded, and BITLINE1 is floated, no current should flow from the WORDLINE 38 to BITLINE0 due to the thin dielectric layer 34. The state of this particular bit of BITLINE0 can thereby be determined as "non-programmed" due to the absence of current. However, if the thin dielectric layer 34 between the WORDLINE 38 and this bit of BITLINE0 has become an electrical short circuit, then current will flow from the WORDLINE 38 to the BITLINE0 at this bit location due to the forward bias of the diode D0. The thin dielectric layer 34 becomes a short circuit if a large forward bias voltage from WORDLINE 38 to BITLINE0 is forced. The thin dielectric layer 34 will permanently breakdown and become a short circuit. This represents the "programmed" state of the anti-fuse memory device.

Referring now to FIG. 2, a memory array is shown at a step of formation. The first conductive lines 14' have been formed by deposition and patterning. At this point, the lines 14' are substantially taller than the final, desired height 50 after the CMP process is completed. The first dielectric layer 30 has been formed overlying the substrate 10 and the lines 14' and filling the gaps between the lines. Note the conductive lines 14' are patterned to a very narrow line-to-line spacing. Therefore, the first dielectric layer 30 must be formed using a technique capable of filling gaps with a high aspect ratio of about three. To achieve this difficult gap fill, a high density plasma (HDP) oxide process is used. In a HDP oxide deposition, the process chemistry and energy levels are set up so that both depositing and etching occur at the same time. That is, the process is both depositing silicon oxide and removing silicon oxide at the same time. The deposition rate is higher than the removal rate so that a net deposition occurs. This process is capable of filling very narrow, high aspect ratio, topologies. The HDP oxide process also results in a very distinctive saw tooth pattern 46 overlying each of the conductive lines 14'.

Referring now to FIG. 3, a CMP process is then performed to remove excess first dielectric layer 30 and to polish down the conductive lines 14 to the final, desired height. This polishing down operation is typically performed using a timed CMP process. Several problems are experienced at this process step. First, the CMP process exhibits poor uniformity both across the wafer and from wafer to wafer. The cross section shows the result in an exaggerated form where the thickness T1 of the N− polysilicon layer 26 BITLINE0 is substantially greater than the thickness T2 of the N− polysilicon layer 26 of BITLINE1. It is found that the final thickness of the N− polysilicon must be carefully controlled to achieve a small leakage current in the final anti-fuse devices. Unfortunately, the within wafer variation of thicknesses T1 and T2 for the N− -polysilicon layer 26 can be between about 600 Å and about 1,000 Å using the timed CMP process.

In addition, the post-CMP thickness is monitored using a polysilicon monitor pad. It is found that the correlation between the polysilicon monitor pad measurement and the actual device N− polysilicon thickness is poor. Further, the correlation becomes worse as array density is increased. The offset between the post-CMP thickness of the monitor pad and of the devices is very difficult to control in the production process. As a result of these observations, an improved method of polishing down the polysilicon bitlines of the anti-fuse memory device is very desirable.

Several prior art inventions relate to chemical mechanical polishing (CMP) methods. U.S. Pat. No. 5,670,410 to Pan teaches a method to form an analog capacitor with a topmost electrode comprising polysilicon. The electrode acts as a marker to detect the endpoint of a CMP operation on an overlying dielectric layer. U.S. Pat. No. 6,391,768 B1 to Lee et al describes a method to chemical mechanical polish a metal layer overlying a dielectric layer. An anti-reflective coating (ARC) is used as a stop layer. One embodiment comprises a silicon oxynitride ARC layer over a silicon oxide layer. Another embodiment comprises a TEOS oxide layer overlying a high-density plasma oxide layer. U.S. Pat. No. 6,261,851 B1 to Li et al describes a method and an apparatus to detect and to monitor ammonia gas given off as a bi-product in a CMP operation. The invention may be used to detect a transition from an oxide layer to a silicon nitride etch stop layer during the polishing step. U.S. Pat. No. 6,294,457

B1 to Liu describes a method to prevent particle contamination during an argon (Ar) sputter operation used for pre-cleaning metal. An oxide layer is optimally placed as the topmost, exposed layer during an Ar sputter pre-clean of a tungsten (W) metal plug. Any bi-products from the sputtering of the oxide will adhere to the quartz walls of the process chamber and not precipitate as contamination particles.

SUMMARY OF THE INVENTION

A principal object of the present invention is to provide an effective and very manufacturable method to polish down conductive lines in the manufacture of an integrated circuit device is achieved.

A further object of the present invention is to provide improved control of final thickness of polished down lines by using two polish stopping levels.

A yet further object of the present invention is to provide a method to improve the manufacturability and performance of an anti-fuse device.

A yet further object of the present invention is to reduce inter-wafer and wafer-to-wafer variation in the thickness of polished down conductive lines.

A yet further object of the present invention is to improve the correlation between the thickness of polished down lines in the anti-fuse devices and of the polished down monitoring device.

Another further object of the present invention is to provide an anti-fuse device with less device-to-device variation.

In accordance with the objects of this invention, a method to polish down conductive lines in the manufacture of an integrated circuit device is achieved. The method comprises providing a plurality of conductive lines overlying a substrate. A high density plasma (HDP) oxide layer is deposited overlying the substrate and the conductive lines. In the regions between the conductive lines, first planar surfaces of the HDP oxide layer are formed below the top of the conductive lines. The HDP oxide layer is sputtered down overlying the conductive lines such that second planar surfaces of the HDP oxide layer are formed above the conductive lines. A polish stopping layer is deposited overlying the HDP oxide layer. A film layer is deposited overlying the polish stopping layer. The film layer is polished down to the polish stopping layer overlying the second planar top surfaces. The film layer, the polish stopping layer, and the conductive lines are polished down to the polish stopping layer overlying the first planar top surfaces to complete the polishing down of the conductive lines.

Also in accordance with the objects of this invention, an integrated circuit device is achieved. The device comprises a plurality of polysilicon lines overlying a substrate. A high density plasma (HDP) oxide layer overlies the substrate in the regions between the polysilicon lines. A polish stopping layer overlies the HDP oxide layer. The top surfaces of the polish stopping layer are approximately at the same height as the top surfaces of the polysilicon lines. The polish stopping layer does not overlie the polysilicon lines.

BRIEF DESCRIPTION OF THE DRAWINGS

In the accompanying drawings forming a material part of this description, there is shown.

DESCRIPTION OF THE PREFERRED EMBODIMENTS

Figure 1:
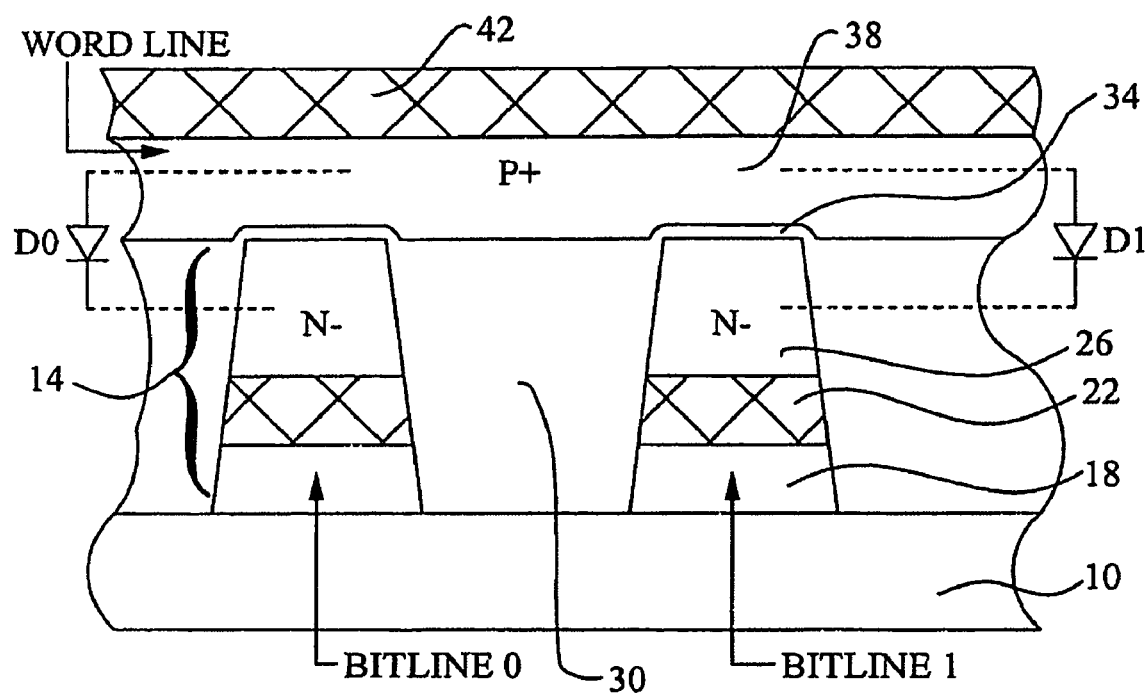
FIG. 1 illustrates an anti-fuse memory device.
Figure 2:
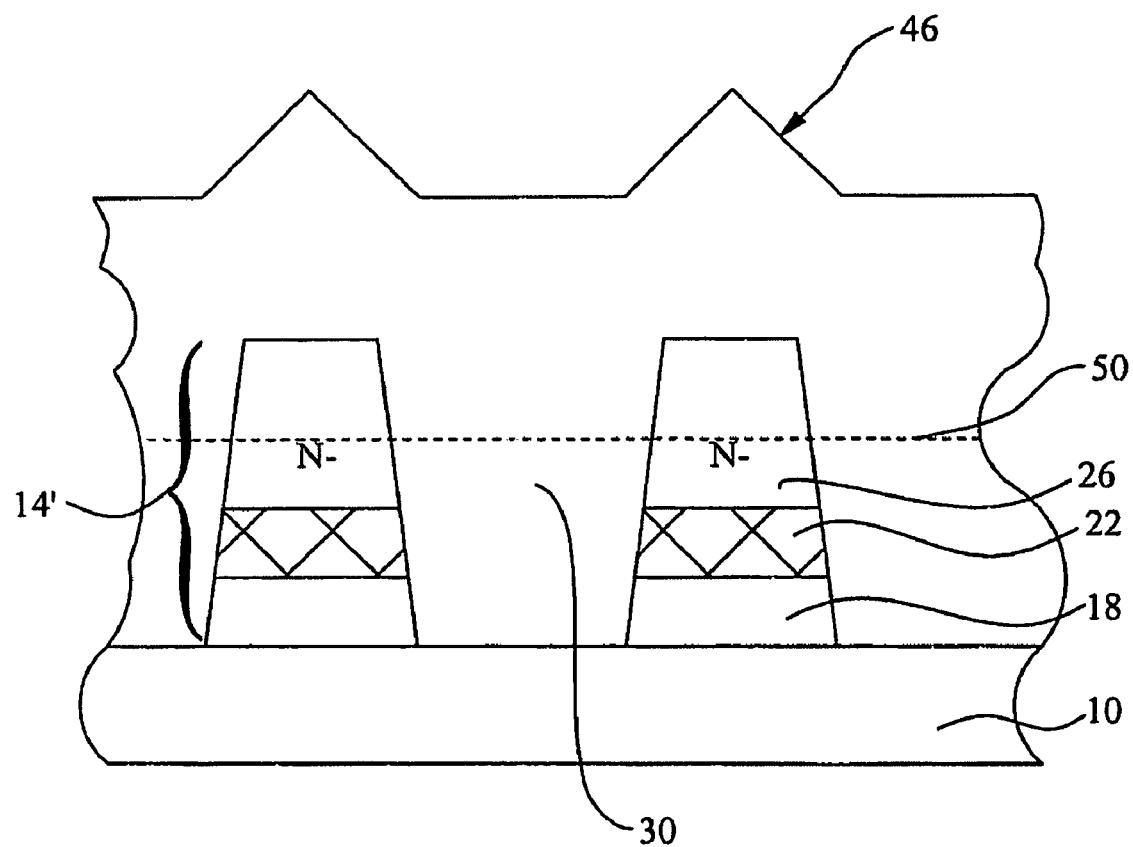
FIGS. 2 and 3 illustrate a prior art method to form an anti-fuse memory device.
Figure 3:
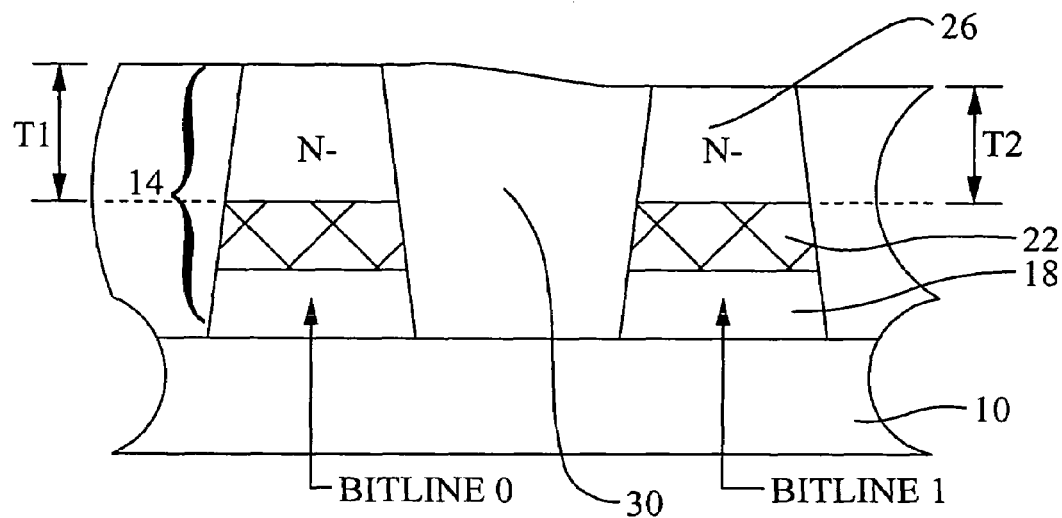

The preferred embodiments of the present invention disclose a method to polish down conductive lines in the manufacture of an integrated circuit device. The method is applied to the formation of anti-fuse, non-volatile memory devices. It should be clear to those experienced in the art that the present invention can be applied and extended without deviating from the scope of the present invention.

Referring now to FIGS. 4 through 12, the preferred embodiment of the present invention is illustrated. Several important features of the present invention are shown and discussed below. In the most general case, the method can be used to polish down any conductive lines overlying a substrate. In the specific embodiment shown, the method is applied to the fabrication to anti-fuse memory devices. Referring again particularly to FIG. 4, the method comprises, first, providing a plurality of conductive lines 76' overlying a substrate 60. The conductive lines 76' may comprise a variety of metals, such as aluminum, copper, aluminum alloys, and copper alloys, or semiconductor materials, such as silicon and germanium, as are known in the art.

In the preferred case the conductive lines 76' comprise polysilicon. More preferably, the conductive lines 76' comprise a first polysilicon layer 64, a metal silicide layer 68, and a second polysilicon layer 72. For example, the first polysilicon layer 64 may be deposited overlying the substrate 60 using a chemical vapor deposition (CVD) or low-pressure CVD process with a silane-based precursor. The first polysilicon layer 64 may be doped or undoped. The first polysilicon layer 64 is preferably deposited to a thickness of between about 1,000 Å and about 2,500 Å. A metal silicide layer 68 is preferably formed overlying the first polysilicon layer 64 to reduce the effective resistivity of the first polysilicon layer 64. The metal silicide layer 68 may be deposited. Preferably, the metal silicide layer 68 is formed by first depositing a reactive metal layer, such as titanium or cobalt, overlying the first polysilicon layer 68 and then performing a thermal anneal to catalyze the reaction between the metal layer and the polysilicon 64 and to thereby form a thick layer of metal silicide 68. Following the thermal anneal, any unreacted metal layer is then removed. The final first polysilicon layer 64 has a preferred thickness of about 1,000 Å. The preferred thickness of the metal silicide layer 68 is between about 500 Å and about 1,500 Å.

The second polysilicon layer 72 is then formed overlying the metal silicide layer 68. The second polysilicon layer 72 is preferably deposited using a CVD or low-pressure CVD process as described above. However, the second polysilicon layer 72 must be doped with an acceptor or donor ion species so that the second polysilicon layer 72 is either n-type or p-type. In the preferred case, the second polysilicon layer 72 is doped to a lightly n-type (N−) ion concentration of between about undoped and about $1 \times 10^{17}$ atoms/cm$^3$. The second polysilicon layer 72 may be doped using either in situ introduction of ions into the CVD deposition process or by an ion implantation step following deposition. The second polysilicon layer 72 is deposited to a thickness that is greater than the desired final thickness. Preferably, the second polysilicon layer is deposited to a thickness of between about 3,000 Å and about 4,500 Å.

Figure 13:
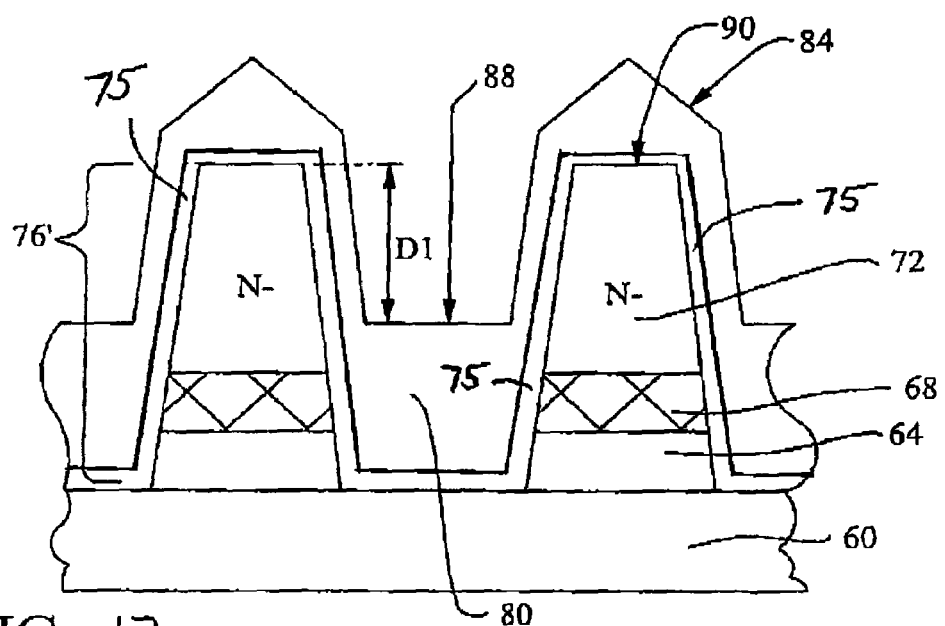
FIG. 13 illustrates an alternative embodiment of the structure shown in FIG. 5.

Following the deposition of the first polysilicon layer 64, the formation of the metal silicide layer 68, and the deposition of the second polysilicon layer 72, the layer stack is patterned to form lines 76'. This patterning step may comprise, for example, coating the surface of the second polysilicon layer 72 with a photoresist layer, not shown. This photoresist layer is then exposed to actinic light through a patterned mask. The exposed photoresist layer is then developed to remove part of the photoresist layer. As a result, the mask pattern is transferred either as a positive image or as a negative image, to the photoresist layer. The photoresist layer is then used to mask an etching process where the second polysilicon layer 72, the metal silicide layer 68, and the first polysilicon layer 64 are etched through as shown. The photoresist layer is then stripped away. The resulting conductive lines 76' comprise the stack of the second polysilicon layer 72, the metal silicide layer 68, and the first polysilicon layer 64. Preferably, the conductive lines 76' are very narrowly spaced and have very narrow widths. In the preferred embodiment, each line 76' has a line width of about 0.25 μm and a line space of about 0.25 μm. By using minimum spaces and widths, a dense anti-fuse array of lines 76' can be created. The resulting gaps 73 between adjacent lines 76' have a large aspect ratio of about three. In another exemplary embodiment an oxide liner layer 75 may be formed conformally on sidewalls 77 of lines 76' as will be shown in FIG. 13.

Figure 4:
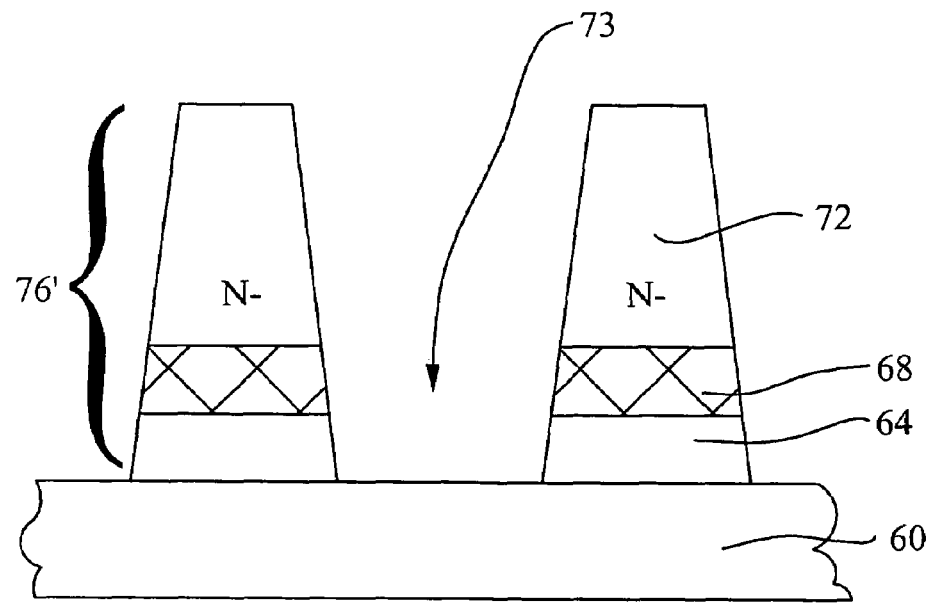
FIGS. 4 through 12 illustrate a preferred embodiment of the present invention showing a method of forming an anti-fuse memory device and showing a preferred device.
Figure 5:
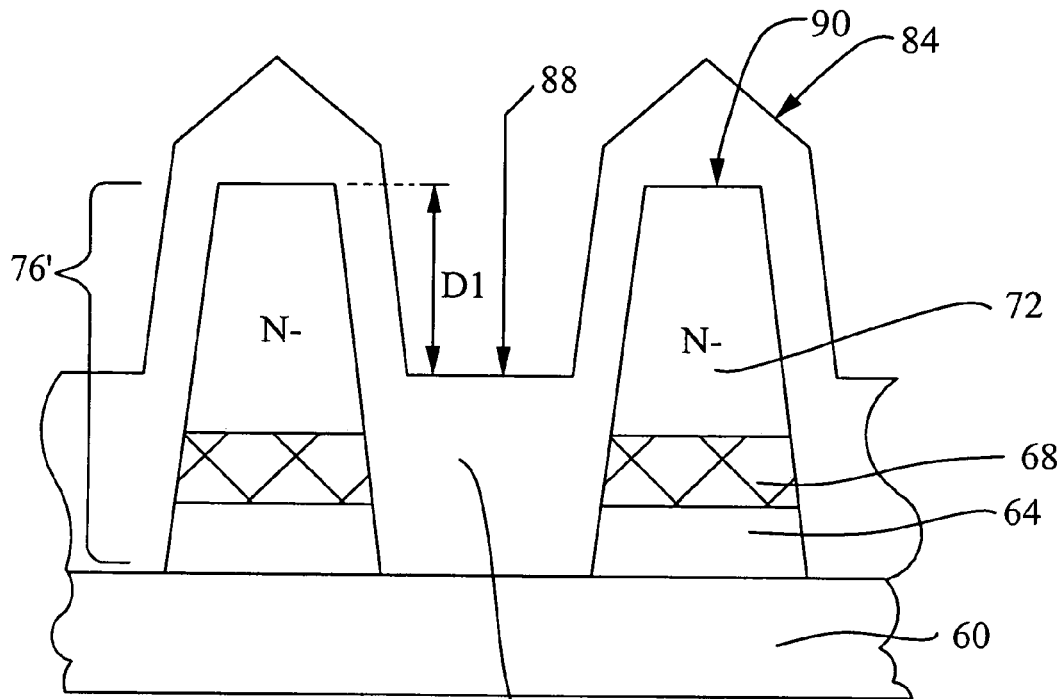

Referring now to FIG. 5, a key feature of the present invention is shown. A high density plasma (HDP) oxide layer is deposited overlying the substrate 60 and the conductive lines 76'. An HDP oxide process is used to achieve excellent gap filling between adjacent conductive lines 76' in the array. As described above, the HDP oxide process both deposits and etches the oxide layer. As a result, a very high quality oxide with complete gap filling characteristic is achieved. As an important feature, the HDP oxide layer 80 is only deposited to partially fill the gaps between the conductive lines 76'. That is, in the regions between the conductive lines 76', first planar surfaces 88 of the HDP oxide layer 80 are formed below the top surfaces 90 of the conductive lines 76'. The HDP oxide deposition is stopped such that first planar surfaces 88 of the HDP oxide layer 80 are a distance D1 below the top surfaces 90 of the second polysilicon layer 72. This distance D1 will set the polishing depth for the subsequent CMP process and is preferably between about 1,500 Å and about 2,500 Å deep. Meanwhile, these same top surfaces 90 of the second polysilicon layer 72 are covered by the HDP oxide layer 80. The HDP oxide layer 80 may exhibit the faceted, or saw-tooth top surface 84 overlying each line. According to another exemplary embodiment in which an oxide liner layer 75 is formed conformally on exposed sidewalls 77 of conductive lines 76' of the structure shown in FIG. 4 shown, in FIG. 13, the HDP oxide is formed over the conformal oxide liner layer 75. In this embodiment HDP oxide lever 80 overlies substrate 60 in regions between liner oxide layers 75 formed on respective of conductive lines 76 and is disposed in between the respective liner oxide layers 75.

Figure 6:
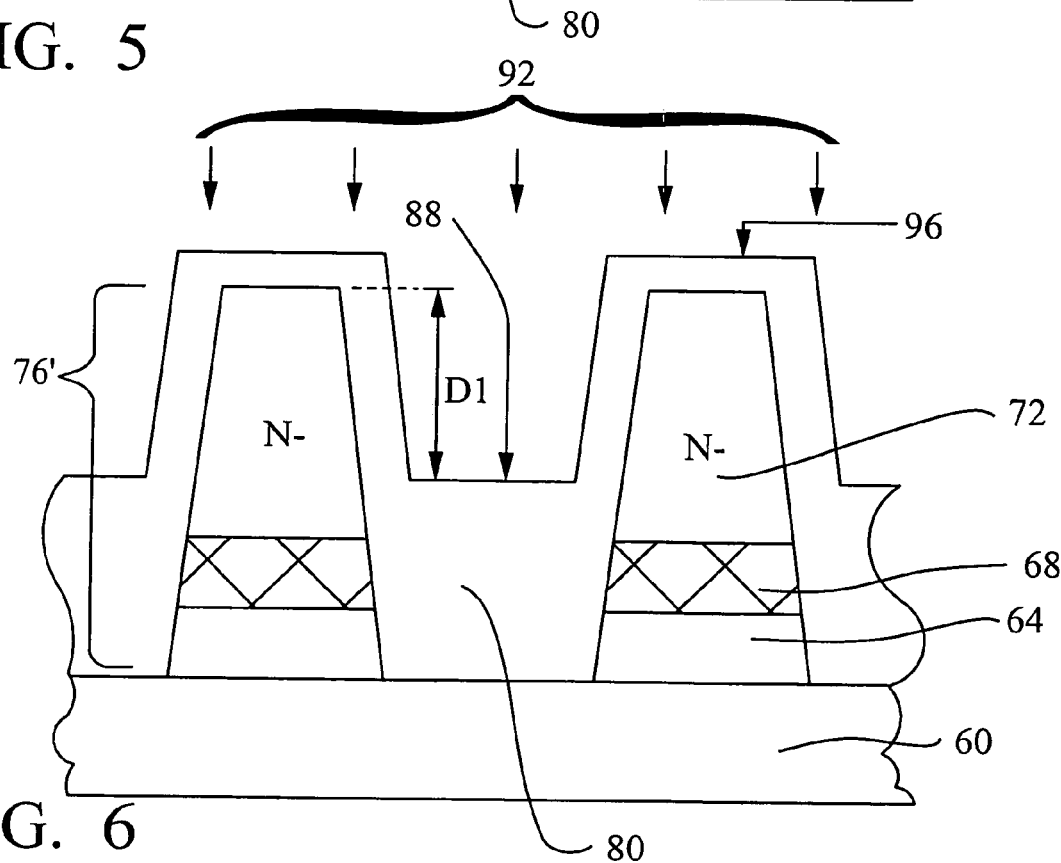

Referring now to FIG. 6, another important feature of the present invention is shown. The HDP oxide layer 80 is sputtered down 92 overlying the conductive lines such that second planar surfaces 96 of the HDP oxide layer 80 are formed above the conductive lines 72. The thickness of the HDP oxide layer 80 in the areas 96 over the second planar surfaces is close to 0 Å. The sputtering down operation preferably uses an inert ion, such as argon (Ar), as a bombardment ion to planarize the topmost surfaces 96 of the HDP oxide layer 80. As a result of the Ar sputtering process, the sharp, saw-tooth surfaces over the second polysilicon layer 72 are smoothed to the second planar surfaces 96. The Ar sputtering step has little effect on the thickness of the HDP oxide layer 80 between the lines 76'. Therefore, the distance D1 between the top surfaces of the second polysilicon layer 72 and the first planar surfaces 88 of the HDP oxide layer 80 is changed very little by the sputter step.

Figure 7:
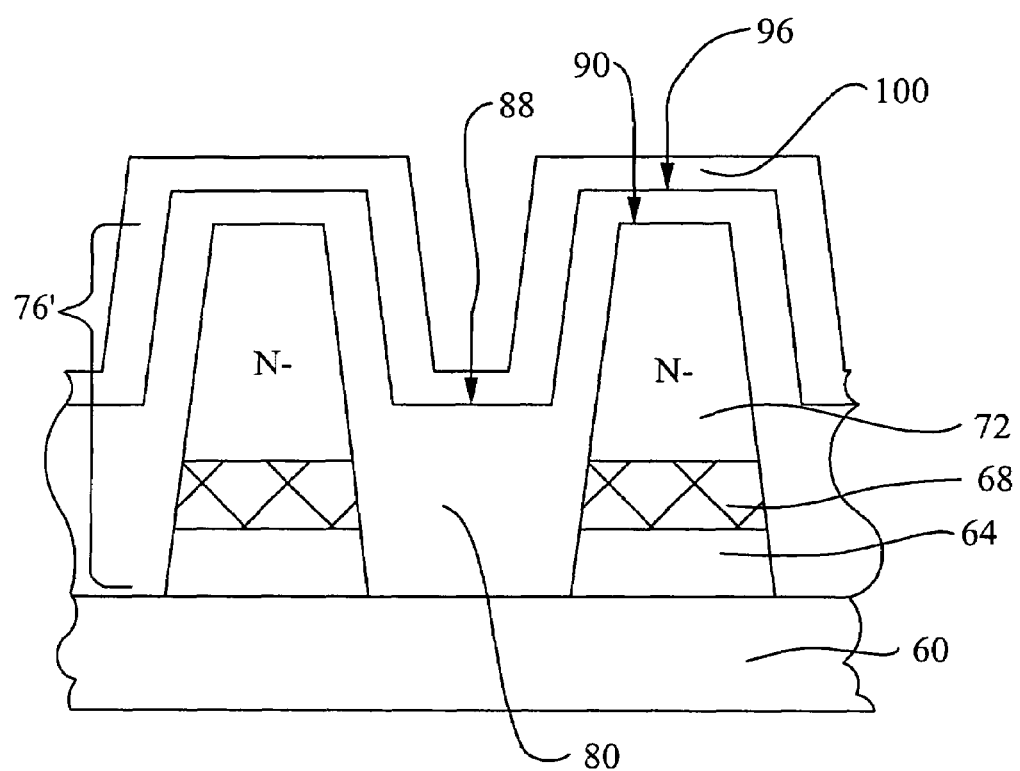

Referring now to FIG. 7, another important aspect of the present invention is illustrated. A polish stopping layer 100 is deposited overlying the HDP oxide layer 80. The polish stopping layer 100 will serve as an endpoint or as a transition point detector for the subsequent CMP step at two important locations. First, the polish stopping layer 100 will serve as a transition detector as the polishing operation is approaching the second planar surfaces 96 of the HDP oxide layer 80 and the top surfaces 90 of the conductive lines 72. Second, the polish stopping layer 100 will serve as an endpoint detector to stop the polishing operation just above the first planar surfaces 88 of the HDP oxide layer 80. The polish stopping layer 100 should comprise a material with a substantially different polishing rate than either the HDP oxide layer 80 or the second polysilicon layer 72. In addition, the polish stopping layer 100 should comprise a material that provides a definite detection sign, such as an emission gas or a photodetectable signature, that can be reliably detected by the endpoint detection apparatus of the CMP process tool. Preferably, the polish stopping layer 100 comprises a silicon nitride layer. This silicon nitride layer 100 is preferably deposited using a CVD or a low pressure CVD process to a thickness of between about 250 Å and about 500 Å.

Figure 8:
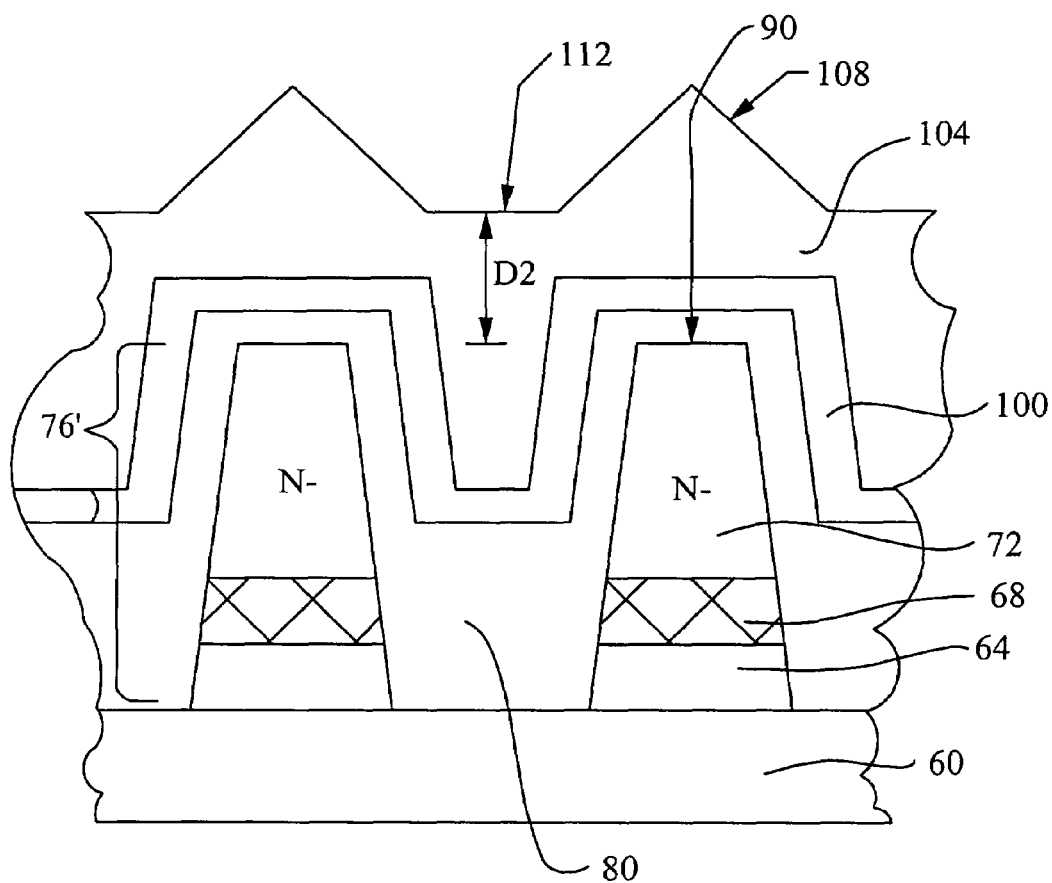

Referring now to FIG. 8, another important step in the present invention is illustrated. A film layer 104 is deposited overlying the polish stopping layer 100. The film layer 104 may comprise a second HDP oxide layer 104, as shown. Alternatively, the film layer 104 may comprise an oxide layer deposited by CVD, such as a TEOS-deposited, oxide layer 104. In either case, the purpose of the film layer 104 is to provide a buffer film for initiating the subsequent polishing down operation. The film layer 104 provides a background polishing characteristic for the CMP endpoint/transition point detection apparatus used to detect the transition to the polish stopping layer 100. The film layer 104 also provides mechanical support, during the polishing, between the conductive lines 76'. The film layer 104 is preferably formed to a thickness D2, above the top surfaces 90 of the second polysilicon layer 72 of between about 2,500 Å and about 4,000 Å.

Figure 9:
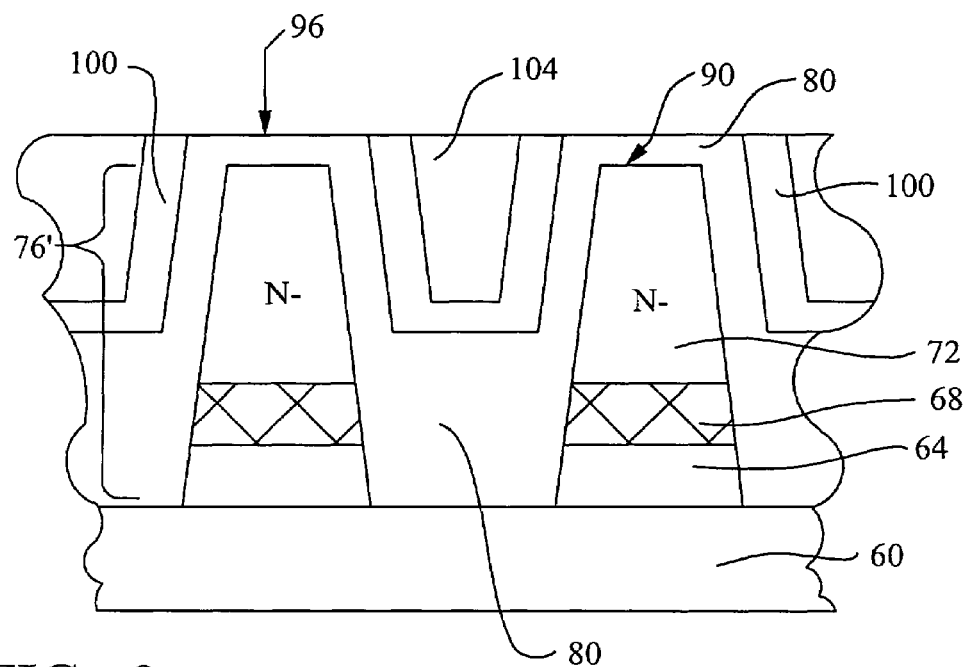

Referring now to FIG. 9, another important feature of the present invention is illustrated. The film layer 104 is polished down to the polish stopping layer 100 overlying the second planar top surfaces 96 of the HDP oxide layer 80. The polishing down step is preferably performed using a chemical mechanical polishing (CMP) operation. In the CMP operation, the wafer is mounted on a supportive chuck. A slurry, comprising abrasive particles is held in suspension in a fluid, is introduced onto the top surface of the wafer. Typically, the wafer is rotated while a rotating polishing pad held in close contact with wafer. The interaction of the abrasive slurry, the polishing pad, and the wafer surface causes a progressive polishing away of the topmost surfaces of the wafer. While the polishing operation is removing the film layer 104, the CMP detection apparatus confirms that surface being removed comprises silicon oxide. However, when the polishing reaches the topmost surface of polish stopping layer 100, then the detection apparatus detects the presence of silicon nitride polish by-products in the slurry or detects an optical difference in the wafer top surface. The apparatus can then conclude that a silicon oxide-to-silicon nitride transition has occurred. In the preferred embodiment, the polish operation continues until a second transition, from silicon nitride to silicon oxide, occurs when the polish stopping layer 100 over the second planar surfaces 96 of the HDP oxide has been totally removed. Alternatively, this first CMP process could stop at the top surface of the polish stopping layer 100. At this point, the conductive lines 76' are protected by the HDP oxide layer 104.

As a further enhancement to the present invention, dummy lines 76' may be used to create a consistent pattern density across the wafer. For example, the first polysilicon layer 64, the metal silicide layer 68, and the second polysilicon layer 72 can be patterned such that a fixed percentage, such as about 50%, of the wafer surface, is covered with lines 76'. Part of the lines 76' are bitlines used in the memory array. Part of the lines 76' are dummy lines that are not used for circuit functions. The use of dummy lines in this way will create a uniform polishing surface across the integrated circuit wafer and will further enhance the uniformity of material removal.

Figure 10:
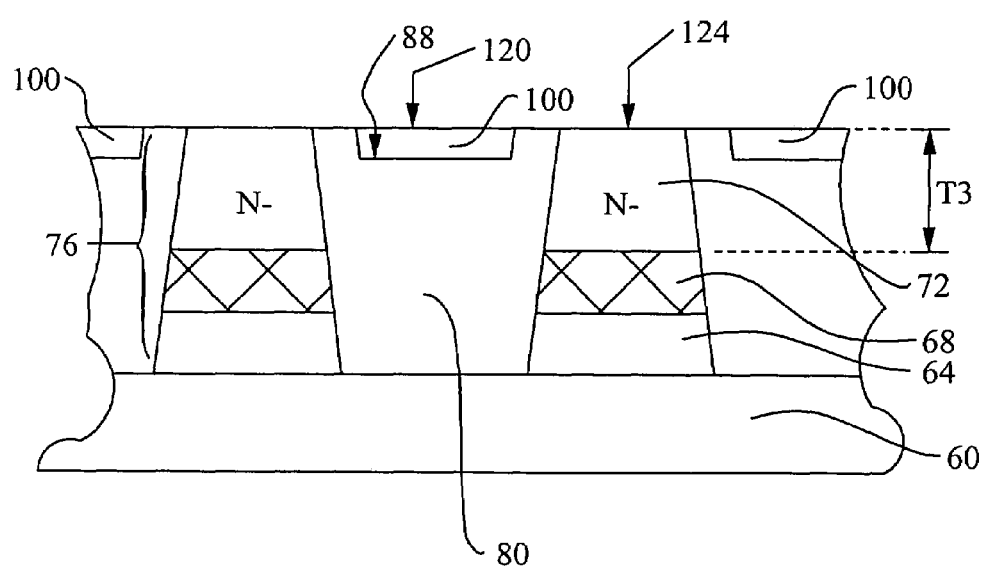

Referring now to FIG. 10, another important step in the present invention is illustrated. The film layer 104, the polish stopping layer 100, and the conductive lines 76 are polished down to the polish stopping layer 100 overlying the first planar top surfaces 88 to complete the polishing down of the conductive lines 76. The second stage of the CMP processing will first remove the portions of HDP oxide layer 80 overlying the second polysilicon layer 72. Next, the second polysilicon layer 72 is polished down. As the second polysilicon layer 72 is polished down, the film layer 104 is polish down along with a small vein of the polish stopping layer 100 that runs parallel to the sidewalls of the second polysilicon layer 72. When the polishing step reaches the polish stopping layer 100 overlying the first planar top surfaces 88, then the CMP endpoint/transition detector detects a large silicon nitride surface area corresponding to the top surface 120 of the polish stopping layer 100. At this point, the CMP process is stopped.

As a result of the endpoint detected CMP process, the second polysilicon layer 72 exhibits a final thickness T3 that is much more uniform across the wafer and from wafer to wafer. This is because the CMP process is now governed by detecting well-placed films. These films are deposited by well-controlled film deposition processes. As a result, the bitlines 76 have a well-controlled n-type polysilicon layer 72 thickness that is key to achieving low leakage current in the final anti-fuse devices. In addition, the polish stopping layer 100 acts as a buffer for the polysilicon polishing. Finally, it is found that the resulting conducting lines exhibit excellent thickness T3 uniformity and predictability and no longer require the use of a monitoring measurement at the CMP step.

Figure 11:
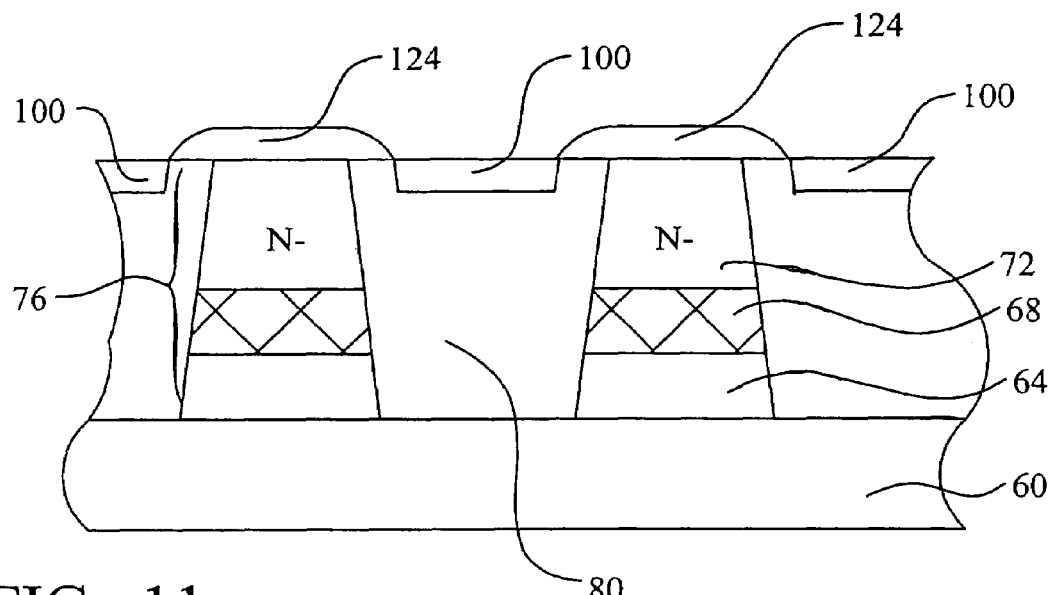

Referring now to FIG. 11, a thin dielectric layer 124 is formed overlying the second polysilicon layer 72. The thin dielectric layer 124 preferably comprises a silicon oxide layer or a silicon nitride layer that is grown over the exposed second polysilicon layer 72 by a rapid thermal anneal (RTA) process. The thin dielectric layer 124 is preferably formed to a thickness of between about 10 Å and about 30 Å.

Figure 12:
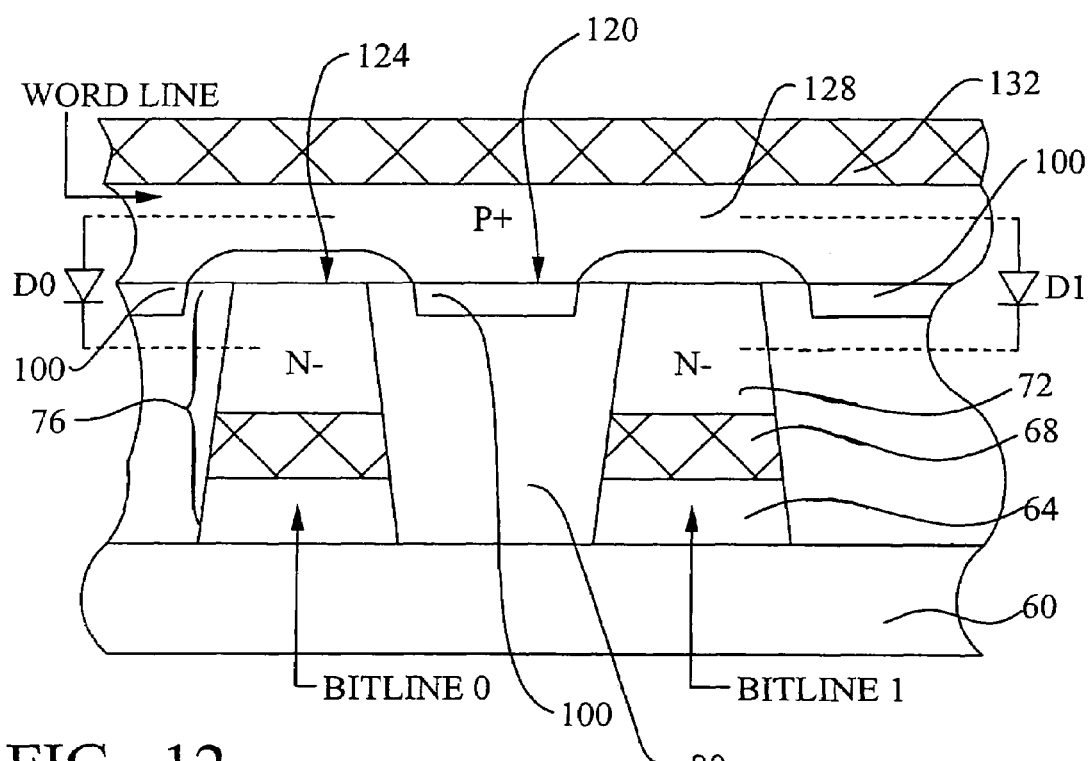

Referring now to FIG. 12, the anti-fuse, non-volatile memory device is completed. A third polysilicon layer 128 is formed overlying the bitlines BITLINE0 and BITLINE1, the polish stopping layer 100, and the thin dielectric layer 124. The third polysilicon layer 128 is doped to a type opposite that of the second polysilicon layer 72. In the preferred embodiment, the third polysilicon layer 128 is heavily doped p-type (P+) with an ion concentration of between about $1 \times 10^{20}$ atoms/cm$^3$ and about $5 \times 10^{21}$ atoms/cm$^3$. The third polysilicon layer 128 is preferably formed by CVD or low pressure CVD deposition to a thickness of between about 1,000 Å and about 2,500 Å. The dopant ion species may be introduced, in situ, into the deposition chamber, or may be ion implanted. A second metal silicide layer 132 may then be formed overlying the third polysilicon layer 128 to further reduce the resistivity of the wordlines WORDLINE formed. The second metal silicide layer 132 is preferably formed using the deposit-anneal-remove process described above. The second metal silicide layer 132 and the third polysilicon layer 128 are patterned to form wordlines WORDLINE for the anti-fuse memory array. The resulting anti-fuse memory device exhibits well-controlled, low current leakage.

The resulting structure can now be described. The structure comprises a plurality of polysilicon lines 72 overlying a substrate 60. A high density plasma (HDP) oxide layer 80 overlies the substrate 60 in the regions between the polysilicon lines 72. A polish stopping layer 100 overlies the HDP oxide layer 80. The top surfaces 120 of the polish stopping layer 100 are approximately at the same height as the top surfaces 124 of the polysilicon lines 72. The polish stopping layer 100 does not overlie the polysilicon lines 72.

The advantages of the present invention may now be summarized. An effective and very manufacturable method9 to polish down conductive lines in the manufacture of an integrated circuit device is achieved. Improved control of final thickness of polished down lines is achieved by using two polish stopping levels. The method improves the manufacturability and performance of an anti-fuse device. Inter-wafer and wafer-to-wafer variation in the thickness of polished down conductive lines is reduced. The correlation between the thickness of polished down lines in the anti-fuse devices and of the polished down monitoring device is improved. An anti-fuse device with less device-to-device variation is thereby achieved.

As shown in the preferred embodiments, the novel method and device of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device, said device comprising:
   a plurality of polysilicon conductive lines overlying a substrate;
   a HDP oxide layer overlying said substrate in regions between said polysilicon conductive lines; and
   a polish stopping layer overlying said HDP oxide layer and formed of a material with a substantially different polishing rate than polysilicon;
   wherein a top surface of said polish stopping layer is approximately at the same height as top surfaces of said polysilicon conductive lines and wherein said polish stopping layer does not overlie said polysilicon conductive lines and each said polysilicon conductive line comprises a stack of an upper polysilicon layer overlying a lower polysilicon layer with a metal silicide layer therebetween.

2. The integrated circuit device according to claim 1 wherein said polysilicon conductive lines comprise bit lines for a nonvolatile memory device.

3. The integrated circuit device according to claim 1 wherein said polish stopping layer comprises silicon nitride.

4. An integrated circuit device, said device comprising:
   a plurality of conductive lines overlying a substrate;
   a liner oxide layer disposed conformally on sidewalls of said conductive lines;
   a HDP oxide layer overlying said substrate in regions between said liner oxide layer; and a polish stopping layer overlying said HDP oxide layer wherein top surfaces of said polish stopping layer are approximately at the same height as top surfaces of said conductive lines and wherein said polish stopping layer comprises a material with a substantially different polishing rate than said conductive lines and does not overlie said conductive lines, wherein said conductive lines comprise bit lines for a nonvolatile memory device, wherein each said conductive line comprises a stack of a second polysilicon layer overlying a first polysilicon layer with a metal silicon layer therebetween.

5. An integrated circuit device, said device comprising:
a plurality of polysilicon lines overlying a substrate;
a high density plasma (HDP) oxide layer overlying said substrate in regions between said polysilicon lines; and
a silicon nitride polish stopping layer overlying said HDP oxide layer wherein top surfaces of said silicon nitride polish stopping layer are approximately at the same height as top surfaces of said polysilicon lines and wherein said silicon nitride polish stopping layer does not overlie said polysilicon lines,
wherein each said polysilicon line comprises a stack of a second polysilicon layer overlying a first polysilicon layer with a metal silicide layer therebetween.

6. The integrated circuit device according to claim 5 wherein said polysilicon lines comprise n-type polysilicon lines and further comprising;
a dielectric layer overlying said n-type polysilicon lines; and
p-type polysilicon lines overlying said dielectric layer wherein said p-type polysilicon lines cross over said n-type polysilicon lines with said dielectric layer therebetween.

7. The integrated circuit device according to claim 6 wherein said dielectric layer comprises silicon oxide or silicon nitride.

8. The integrated circuit device according to claim 6 wherein some of said n-type polysilicon lines are bit lines and some of said p-type polysilicon lines are word lines for a non-volatile memory device.

9. The integrated circuit device according to claim 6 wherein other of said n-type polysilicon lines are not bit lines but are used to provide a uniform pattern density of said n-type polysilicon lines across said substrate.

* * * * *